United States Patent [19]

Gupta

[11] Patent Number: 5,353,248
[45] Date of Patent: Oct. 4, 1994

[54] EEPROM-BACKED FIFO MEMORY

[75] Inventor: Anil Gupta, San Jose, Calif.

[73] Assignee: Altera Corporation, San Jose, Calif.

[21] Appl. No.: 868,174

[22] Filed: Apr. 14, 1992

[51] Int. Cl.$^5$ .......................................... G11C 11/40
[52] U.S. Cl. ................... 365/154; 365/221; 365/228
[58] Field of Search ............. 365/228, 154, 221

[56] References Cited

U.S. PATENT DOCUMENTS

| | | | |
|---|---|---|---|
| 4,207,615 | 6/1980 | Mar | 365/228 |
| 4,337,522 | 6/1982 | Stewart | 365/228 |
| 4,388,704 | 6/1983 | Bertin et al. | 365/154 |
| 4,400,799 | 8/1983 | Gudger | 365/228 |
| 4,499,560 | 2/1985 | Brice | 365/228 |
| 4,594,688 | 6/1986 | Uno | 365/228 |
| 4,707,807 | 11/1987 | Cuppens et al. | 365/228 |
| 4,763,333 | 8/1988 | Byrd | 365/228 |
| 4,809,225 | 2/1989 | Dimmler et al. | 365/228 |
| 4,980,859 | 12/1990 | Guterman et al. | 365/228 |
| 5,075,888 | 12/1991 | Yamauchi et al. | 365/228 |
| 5,168,463 | 12/1992 | Ikeda et al. | 365/221 |

*Primary Examiner*—Eugene R. LaRoche
*Assistant Examiner*—Son Dinh
*Attorney, Agent, or Firm*—Robert R. Jackson; Robert W. Morris

[57] ABSTRACT

A first-in, first-out (FIFO) static random access memory (SRAM) device includes EEPROM cells which provide non-volatile backup capability. The sizing of each SRAM cell is such that its associated EEPROM cell is automatically programmed via the output of the SRAM cell. Upon power-up, the EEPROM cell restores the SRAM cell to the inverse of whatever state it was in prior to the most recent EEPROM programming (before a preceding power-down). This provides non-volatility to the SRAM without a significant increase in manufacturing costs or overhead.

17 Claims, 4 Drawing Sheets

EEPROM-BACKED FIFO MEMORY

BACKGROUND OF THE INVENTION

This invention relates to static random access memories (SRAMs), and more particularly, to backing up SRAMs with electrically erasable programmable read-only memories (EEPROMs) when SRAMs are used as first-in first-out (FIFO) serial memory devices.

Integrated circuit devices such as programmable logic arrays typically need large numbers of transfer devices for such purposes as (1) multiplexing various signals through a single output, (2) circuit control, and (3) data transfer. These transfer devices are typically controlled through the use of FIFO SRAMs to select or de-select the gates of the devices. SRAMs, by their nature, are volatile devices (i.e., they lose the stored information when the circuit is unpowered). Therefore, the controlling data must be re-written into them on each power-up operation.

Heretofore, circuit designs that require non-volatile serial memory elements (i.e., memory elements that retain the stored information even when the circuit is unpowered) have had to rely on serial electrically programmable read-only memory (EPROM). The addition of serial EPROM elements to the programmable logic array (on the same, or on a separate integrated circuit chip) can cause an increase in design complexity and manufacturing costs, as well as an increase in array over head costs.

In view of the foregoing, it is an object of this invention to utilize EEPROM elements to provide a non-volatile backup to FIFO SRAM elements, thereby eliminating the need for serial EPROM devices. It is a further object of the invention to provide the capability to automatically program each EEPROM cell from its associated SRAM cell, thereby reducing the over head of the additional EEPROM cells.

SUMMARY OF THE INVENTION

These and other objects of the invention are accomplished in accordance with the principles of the invention by providing an EEPROM cell for each SRAM cell element of a FIFO, thereby creating a non-volatile SRAM FIFO. The sizing of the SRAM cell (i.e., the sizes of the back-to-back inverters relative to one another) is such that the SRAM cell will power up to logic 1 if the EEPROM is not conducting. If the EEPROM is conducting, the SRAM cell will power up to logic 0. The EEPROMs are all initially set to be non-conducting, and are individually made conducting when the associated SRAM cell is set to logic 1. In this manner, each EEPROM cell is automatically programmed by its associated SRAM cell.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
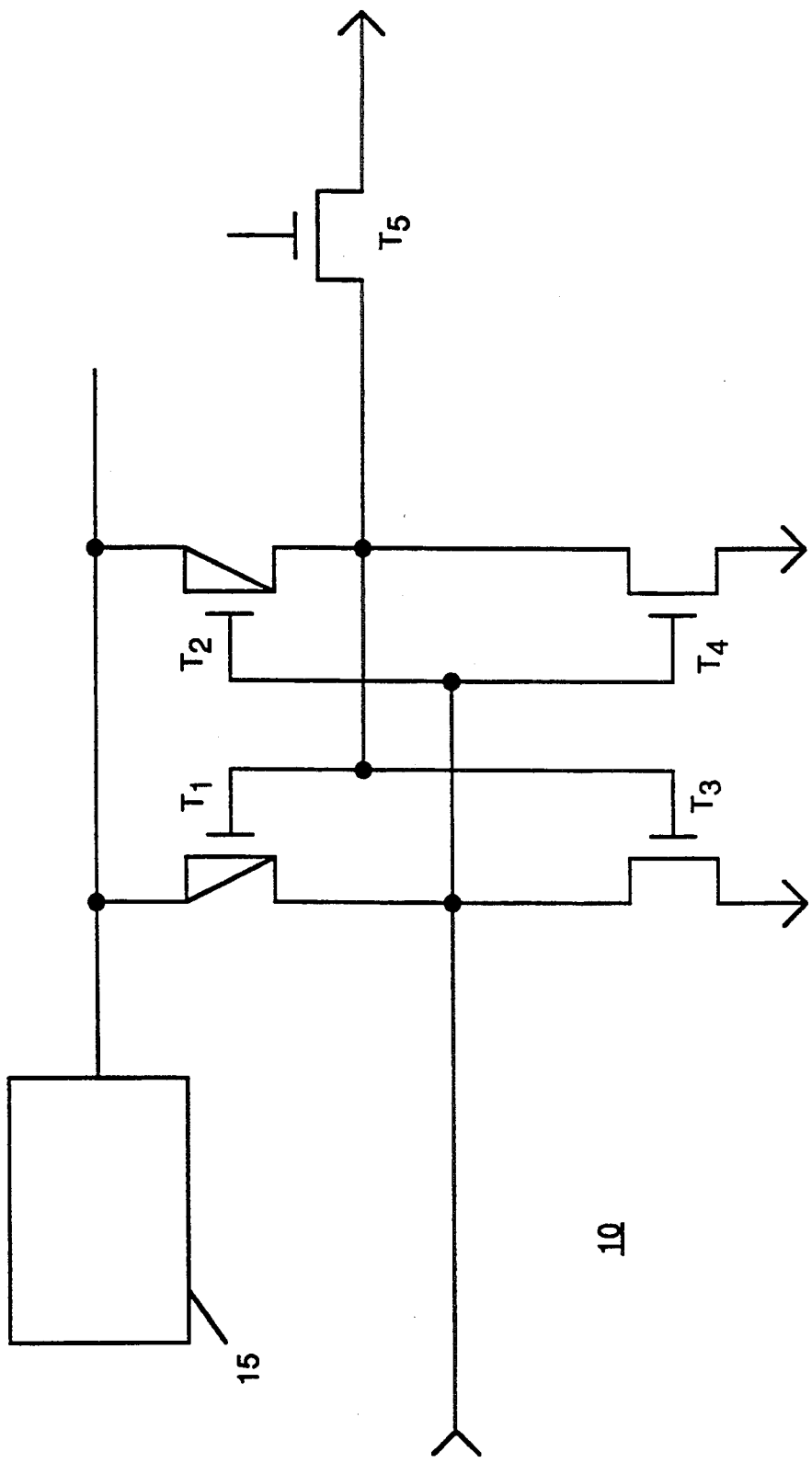
FIG. 1 is a schematic diagram of a typical prior art SRAM cell.

FIG. 1 shows a typical prior art SRAM cell 10, which represents one cell in a FIFO chain. SRAM cell 10 includes global controllable voltage source 15 (which provides a voltage $V_{CC}$ to all SRAM cells in a given circuit), p-channel transistors $T_1$ and $T_2$, and n-channel transistors $T_3$, $T_4$, and $T_5$. Transistor pairs $T_1$, $T_3$ and $T_2$, $T_4$ individually act as inverters, inverter $T_2$, $T_4$ being stronger than inverter $T_1$, $T_3$. When coupled together (as shown in FIG. 1), the transistor pairs function as a storage cell. Pass transistor $T_5$ is used to control data transfer between storage cells. Data enters the current storage cell when pass transistor $T_5$ from the previous cell in the FIFO chain is set to be conducting. Similarly, data is passed to the next cell in the FIFO chain by setting current transistor $T_5$ to be conducting. Typically, all pass transistors $T_5$ in a FIFO chain are set to be conducting during the loading of the FIFO chain and each pass transistor $T_5$, in sequence from the output towards the input, is set to be non-conducting after loading of a binary digit in the associated cell occurs. When power at predetermined voltage source 15 goes to zero, the SRAM cell loses its capability to retain stored information.

Figure 2:
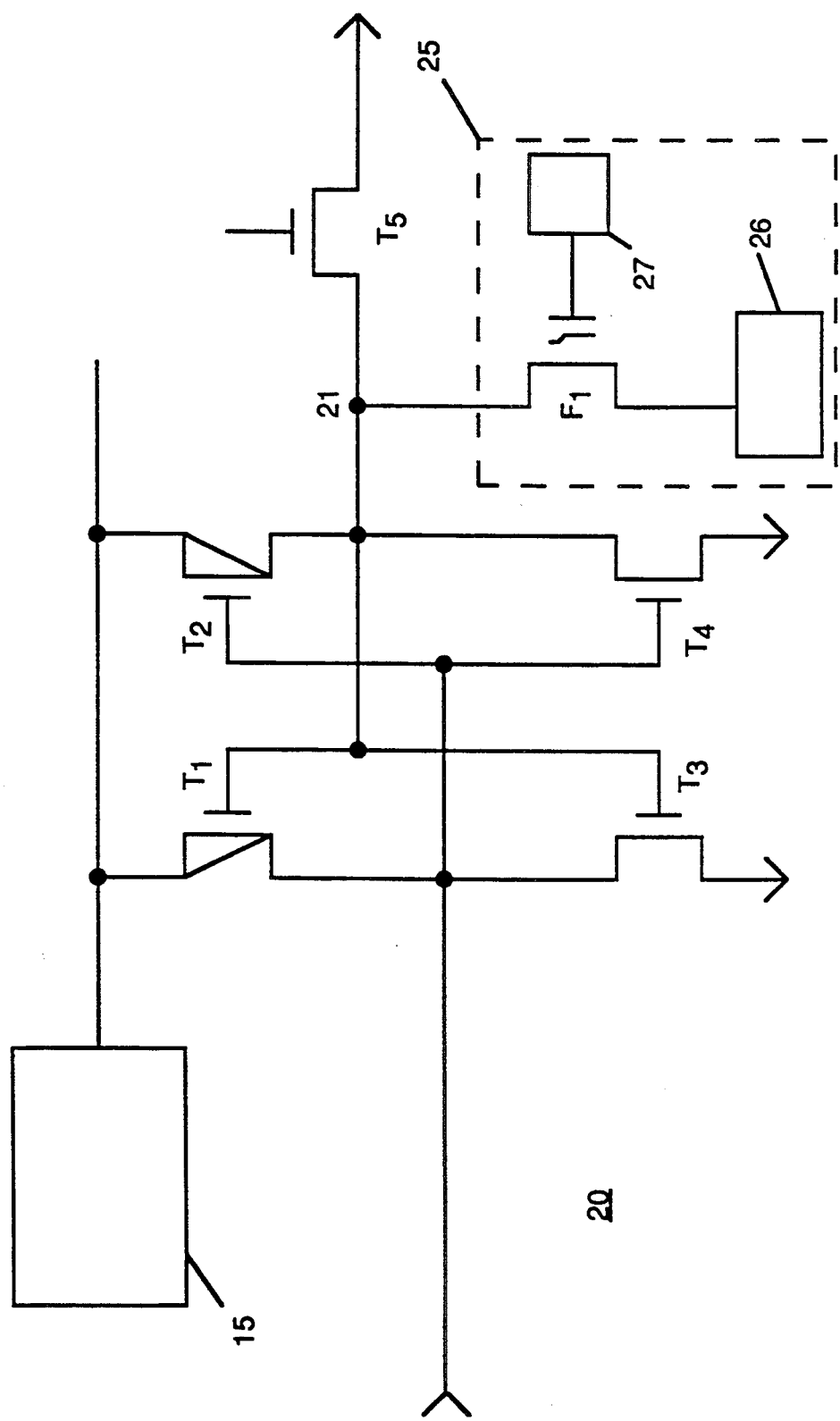
FIG. 2 is a schematic diagram of a first illustrative embodiment of an EEPROM-backed FIFO element constructed in accordance with the principles of this invention.

FIG. 2 shows an embodiment of the invention in the design of EEPROM-backed SRAM cell 20. SRAM cell 20 includes all of the circuitry of SRAM cell 10, with the addition of EEPROM cell 25. EEPROM cell 25 includes floating gate transistor $F_1$ and controllable voltage sources 26 and 27. Voltage sources 26 and 27 may be global voltage sources, whereby they supply power to all of the EEPROM cells that are used to backup SRAM cells for a given FIFO circuit configuration. Due to the nature of this implementation, EEPROM cell 25 can be added to an SRAM cell without including a series n-channel transistor that is usually required for decoding an EEPROM cell. The lack of this n-channel transistor helps reduce the relatively small over-head that accompanies the addition of the EEPROM cells.

Preparation for normal operation of a FIFO made using SRAM cells of this invention begins with a global erase being performed on all of the EEPROM backup cells. This is typically accomplished by setting voltage source 27 to a high voltage, such as 5 volts, and voltage source 26 to 0 volts, while voltage source 15 is raised from 0 volts to approximately 5 volts. This causes node 21 to be approximately 0 volts. Voltage source 27 is then used to momentarily apply a very high voltage, such as 15 volts, to the gate of transistor $F_1$. This causes a negative charge to build up on the floating gate of transistor $F_1$ which inhibits transistor $F_1$ from conducting at normal logic levels. In the final step, before normal operation of the SRAM cells can occur, voltage source 27 is returned to zero.

During normal operation of a FIFO made of EEPROM-backed SRAM cells of this invention, information is passed from SRAM cell to SRAM cell, as described above, until the FIFO chain is full. After loading of the FIFO is complete, selective programming of the EEPROM cells occurs by typically setting voltage source 27 to zero, voltage source 26 to a high voltage, such as 5 volts. This is followed by momentarily raising voltage source 15 from a relatively high voltage such as 5 volts to a relatively very high voltage such as 15 volts. This will cause automatic programming of the selected EEPROM cells. If node 21 (the output of the SRAM cell) is set to logical 1, the very high voltage of voltage source 15, which is seen at node 21, will cause the charge to be removed from the floating gate of transistor $F_1$, thereby changing transistor $F_1$ from non-conducting to conducting. If node 21 is set to logical 0, the very high voltage of predetermined voltage source 15 will not be seen at node 21. This will cause the charge to remain on the floating gate of transistor $F_1$, which therefore remains non-conducting.

When power is shut down, each EEPROM cell will retain the information that was stored in its associated SRAM cell. During a normal power-up sequence, voltage sources 26 and 27 are set to zero and voltage source 15 is set to a high voltage such as 5 volts. The SRAM cells are designed such that the size of the back-to-back inverter pairs, relative to one another, causes node 21 to power up to a logical 1 when EEPROM cell 25 is non-conducting. This occurs because the high voltage from predetermined voltage source 15 will not be conducted across transistor $F_1$ to ground (due to the fact that transistor $F_1$ is non-conducting), and remains at node 21. On the other hand, if EEPROM cell 25 is conducting, node 21 will be pulled to a level of zero volts across transistor $F_1$. In this manner, the inverse of the information existing in the SRAM cell prior to the most recent EEPROM programming (before a preceding power-down) is restored to the SRAM cell. The primary objective of retaining the SRAM data in a non-volatile form has been accomplished. It is a trivial task to manipulate this inverted data within the software of a given system using FIFO cells of this invention.

Figure 3:
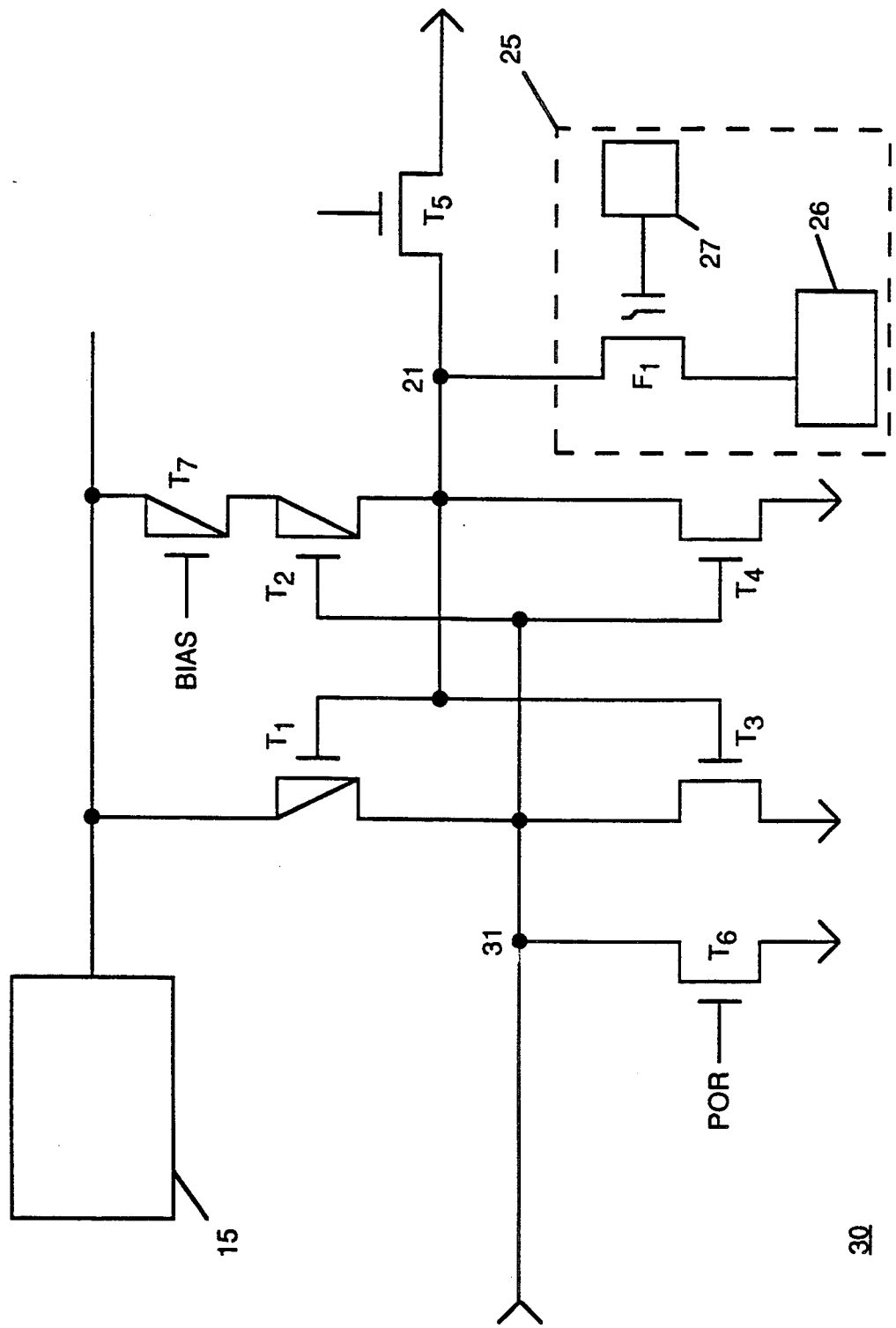
FIG. 3 is a schematic diagram of a second illustrative embodiment of an EEPROM-backed FIFO element.

FIG. 3 shows an alternative embodiment wherein EEPROM-backed SRAM cell 30 is constructed using all of the same hardware as EEPROM-backed SRAM cell 20 in addition to power-on-reset transistor $T_6$ and bias transistor $T_7$. Transistors $T_6$ and $T_7$ are used to provide a more positive method of ensuring that data is restored properly during power-up. For normal power-up operation, transistor $T_6$ is set high, thereby setting node 31 to logical 0, which causes node 21 to be a logical 1. At the same time, transistor $T_7$ is set to an approximate value between 3 and 3.5 volts, causing the normally strong inverter pair ($T_2$, $T_4$) to be weak. Voltage source 26 is set to logical 0, while voltage source 27 is pulsed to 5 volts, causing EEPROM $F_1$ to be more conducting. This permits the value at node 21 to change from a logical 1 to a logical 0 if EEPROM cell 25 is conducting. As in the circuit of FIG. 2, the inverse of the information existing in the SRAM cell prior to the most recent EEPROM programming (before a preceding power-down) is restored to the SRAM cell. During normal operation, transistors $T_6$ and $T_7$ are set to zero, thereby restoring transistor pair $T_2$, $T_4$ back to being a strong inverter.

Figure 4:
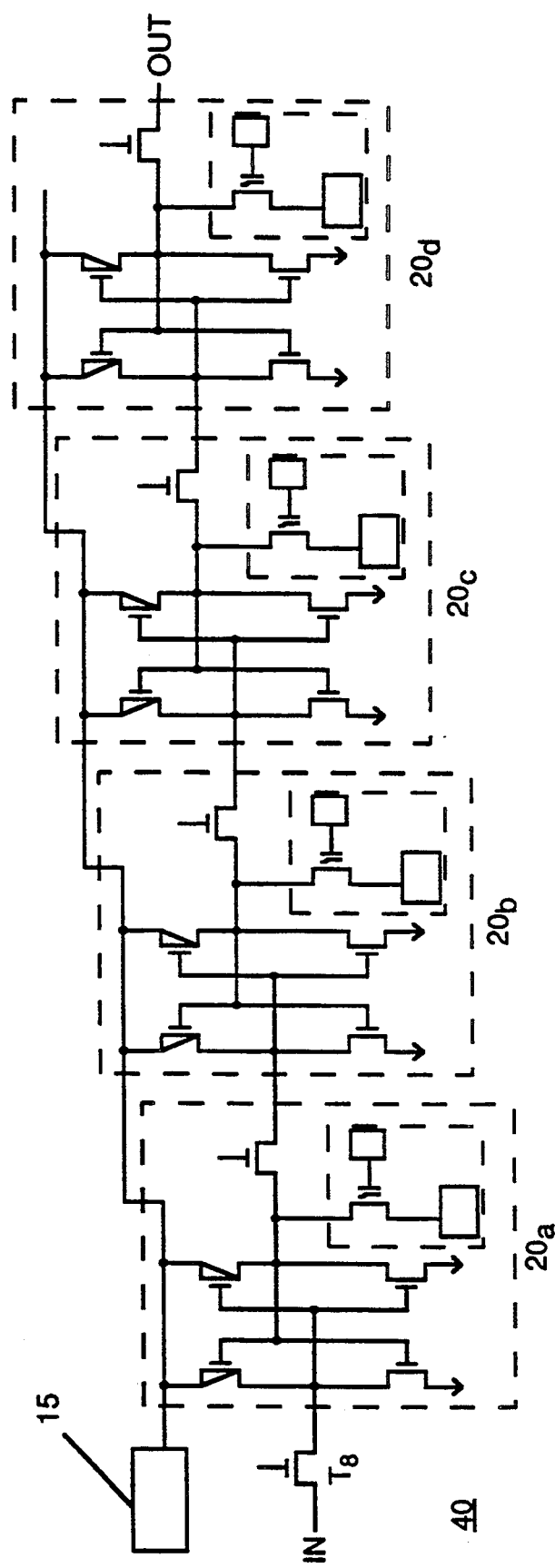
FIG. 4 is a schematic diagram of an illustrative embodiment of a four-element EEPROM-backed FIFO, using the FIFO elements of FIG. 2, in accordance with the principles of this invention.

FIG. 4 shows an illustrative example of the invention in four-element EEPROM-backed FIFO 40, which comprises four instances of EEPROM-backed SRAM cell 20, global voltage source 15, and input transistor $T_8$. As previously described, this four-element FIFO would be loaded with four binary digits of information, sequentially through IN. Transistor $T_8$ and the first three instances of transistor $T_5$ would be turned on to allow the first binary digit to travel from IN to the last SRAM cell $20_d$. Transistor $T_5$ in SRAM cell $20_c$ would then be turned off in preparation of the second binary digit being loaded into the FIFO. The same sequence is followed for loading the remaining three binary digits of information into SRAM cells $20_c$, $20_b$, and $20_a$. After loading of the FIFO has been completed, the EEPROM cells can be programmed using global voltage source 15, as described above. Restoring the SRAM cells of FIFO 40 after power-down is also performed as described above.

It will be understood that the foregoing is merely illustrative of the principles of this invention, and that various modifications can be made by those skilled in the art without departing from the scope and spirit of the invention. For example, EEPROM-backed SRAM cell 30 can be substituted for cell 20 in FIFO 40 to provide an alternate method of ensuring proper data restoration after a power-down.

The invention claimed is:

1. A static random access memory cell for storing a momentarily applied binary digit and for automatically returning to a state indicative of said applied binary digit after any interruption in the power supplied to said cell comprising:

a first relatively strong inverter having an input terminal and an output terminal, said binary digit being momentarily applied to said input terminal;

a second relatively weak inverter having an input terminal connected to the output terminal of said first inverter and an output terminal connected to the input terminal of said first inverter, said second inverter being weak enough to allow said momentarily applied binary digit to control the state of said first inverter, but strong enough to hold said first inverter in the state established by said momentarily applied binary digit even after said binary digit is no longer being applied;

a first controllable potential source;

a second controllable potential source;

an electrically erasable programmable read-only memory (EEPROM) transistor having a gate, a floating gate, a source, and a drain, said gate being connected to said first controllable potential source, said EEPROM transistor being connected between said output terminal of said first inverter and said second controllable potential source via said source and drain, said EEPROM transistor being at least initially non-conducting as a result of a charge stored on said floating gate of said EEPROM transistor; and means for momentarily increasing the potential of the output terminal of said first inverter if and only if said momentarily applied binary digit has placed said first inverter in a predetermined state, said increased potential being sufficient to remove said charge from said EEPROM transistor and thereby rendering said EEPROM transistor conducting so that if the power supplied to said cell is interrupted, said EEPROM transistor causes said first inverter to return to a first state when said power is restored if said EEPROM transistor is non-conducting, and causes said first inverter to return to a second state when said power is restored if said EEPROM transistor is conducting; wherein said first controllable potential source momentarily applies a relatively very high potential to said gate to cause said charge to be stored on said floating gate during a global erase of said EEPROM; and said first controllable potential source applies a relatively low potential to said gate while said means for momentarily increasing is operating to increase the potential of the output of said first inverter.

2. The apparatus defined in claim 1 wherein said first controllable potential source applies said relatively low potential and said second controllable potential source applies said relatively low potential and said means for momentarily increasing applies a potential intermediate said relatively high potential and said relatively low potential while said EEPROM transistor is causing said first inverter to return to said first or said second state when said power is restored.

3. The apparatus defined in claim 1 wherein said cell is one of a series of similar cells, and wherein said apparatus further comprises:

a plurality of pass transistors, each of which is associated with a respective one of said cells, each pass transistor being connected in series between the output terminal of the first inverter in the associated cell and the input terminal of the first inverter of the next cell in said series and each pass transistor being operable such that a plurality of pass transistors may be enabled at the same time so that a binary digit may be passed to a plurality of cells essentially simultaneously.

4. The method of operating a static random access memory cell which includes (1) means for storing a momentarily applied binary digit, (2) an electrically erasable programmable read-only memory (EEPROM) transistor for restoring said means for storing to a state indicative of said applied binary digit after any interruption in the power supply to said cell, said EEPROM transistor having a gate, a floating gate, and a source-drain channel, said source-drain channel connected to an output terminal of said means for storing, and (3) a controllable potential source connected to said gate, said method comprising the steps of:

clearing said EEPROM transistor by storing a charge on said floating gate to render said EEPROM transistor non-conducting;

momentarily applying said binary digit to said means for storing to place said means for storing in a state indicative of said applied binary digit;

raising the potential of the output terminal of said means for storing to a potential greater than the normal logic potential if and only if said means for storing is in a predetermined one of said first and second states in order to remove said charge from said floating gate so that the presence or absence of charge on said EEPROM transistor is indicative of the state of said means for storing;

applying a relatively low potential to said gate of said EEPROM transistor while performing said raising step; and using said EEPROM transistor to control the state of said means for storing after any interruption in the power supplied to said cell, said EEPROM transistor placing said means for storing in a first state after a power interruption if a charge is present on said EEPROM transistor, and said EEPROM transistor placing said means for storing in a second state after a power interruption if a charge is absent from said EEPROM transistor.

5. The method defined in claim 4 wherein said EEPROM transistor has a gate, a floating gate, and a source-drain channel, wherein said source-drain channel is connected to an output terminal of said means for storing, wherein said charge is stored on said floating gate and, if present, renders said source-drain channel non-conducting regardless of the normal logic level applied to said gate, and wherein said step of using said EEPROM transistor comprises the step of:

applying to said gate a potential sufficient to cause said source-drain channel to conduct if and only if no charge is present on said floating gate, thereby placing said means for storing in said second state.

6. The method defined in claim 5 wherein said step of using said EEPROM transistor further comprises the step of:

applying a potential to said output terminal which is sufficient to place said means for storing in said first state unless said source-drain channel is conducting.

7. The method defined in claim 4 wherein said EEPROM transistor has a gate, a floating gate, and a source-drain channel, wherein said source-drain channel is connected to an output terminal of said means for storing, wherein said charge is stored on said floating gate, wherein said source-drain channel can be made to conduct by applying a predetermined potential to said gate only in the absence of a charge on said floating gate, and wherein said method further comprises the step of:

applying to said gate a potential which is not sufficient to cause said source-drain channel to conduct at all times, after performing said step of storing a charge on said EEPROM transistor, except during performance of said step of using said EEPROM transistor to control the state of said means for storing after any interruption in the power supplied to said cell.

8. The method defined in claim 4 wherein said cell is one of a plurality of similar cells connected in a series such that an output terminal of the means for storing in each cell is connected to an input terminal of the means for storing in the next cell in the series via a pass transistor, and wherein said step of momentarily applying said binary digit comprises the steps of:

enabling all of said pass transistors;

momentarily applying a binary digit to the input terminal of said first cell so that said binary digit passes through all of said cells to the cell which is most remote from said first cell;

disabling the pass transistor which is immediately upstream from said most remote cell;

momentarily applying another binary digit to the input terminal of said first cell so that said another binary digit passes through all of said cells to the cell which is just upstream from the most recently disabled pass transistor;

disabling the pass transistor which is just upstream from the most recently disabled pass transistor; and repeating the last two steps until binary digits have been stored in all of said cells and all of said pass transistors have been disabled.

9. Apparatus to provide a non-volatile first-in first-out (FIFO) memory device comprising:

input and output terminals;

an input n-channel transistor having a gate and two sides, with one side being connected to said input terminal;

a plurality of pass transistors;

a plurality of non-volatily backed-up static random access memory (SRAM) cells connected in series, each cell having an input and an output, where said input of said first SRAM cell is connected to said other side of said input transistor and said output of said last SRAM cell is connected to said output terminal, and where one of said plurality of said pass transistors is connected between each pair of SRAM cells within said series connection, wherein a subset of said plurality of said pass transistors can be enabled simultaneously so that a binary digit may be passed to a plurality of SRAM cells essentially simultaneously; and a global predetermined voltage source which provides power to each of said SRAM cells;

wherein each of said plurality of non-volatily backed-up SRAM cells comprises:

a weak inverter comprising a first n-channel transistor having a gate and two sides; and a first p-channel transistor having a gate and two sides, connected serially between said global predetermined voltage source and said one side of said first n-channel transistor, with said other side of said first n-channel transistor being connected to a logical 0;

a strong inverter comprising a second n-channel transistor having a gate and two sides, with said one side connected to logical 0; a second p-channel transistor having a gate and two sides; and a bias p-channel transistor having a gate and two sides, connected serially between said global predetermined voltage source and said one side of said second p-channel transistor, with said other side of said second p-channel transistor being connected to said other side of said n-channel transistor;

an output n-channel transistor serially connected between said output of said non-volatily backed-up SRAM cell and said input of said next sequential non-volatily backed-up SRAM cell;

a power-on-reset transistor having a gate and two sides, with said one side being connected to logical 0;

an electrically erasable programmable read-only memory (EEPROM) cell having an output terminal;

a SRAM cell comprising said weak and strong inverters, having an input connected to said other side of said power-on-reset transistor, and an output which is connected to said output terminal of said EEPROM cell; and means for programming said EEPROM cell.

10. The apparatus defined in claim 9 wherein said input of said SRAM cell is also connected to a node between said serial connection of said first n-channel transistor and said first p-channel transistor, and is also connected to a node between a connection of said gates of said second n-channel and said second p-channel transistors.

11. The apparatus defined in claim 10 wherein said output of said SRAM cell is connected to a node between said serial connection of said second n-channel transistor and said second p-channel transistor, and is also connected to a node between a connection of said gates of said first n-channel and said first p-channel transistors.

12. The apparatus defined in claim 11 wherein said EEPROM cell comprises:

a first predetermined voltage source;

a second predetermined voltage source; and a floating gate transistor having a gate connected to said first predetermined voltage source, and one end connected to said second predetermined voltage source, said other end being connected to said output terminal of said EEPROM cell.

13. The apparatus defined in claim 12 wherein said means for programming said EEPROM cell comprises:

setting said first and second predetermined voltage sources to a logical 0; and momentarily setting said global predetermined voltage source from a relatively high voltage to a relatively very high voltage.

14. The apparatus defined in claim 13 wherein said means for restoring information comprises:

setting said power-on-reset transistor to be conducting;

setting said bias p-channel transistor to a voltage about 3–3.5 volts;

setting said second predetermined voltage source to a logical 0;

setting said global predetermined voltage source from a power-off state to a relatively high voltage; and pulsing said first predetermined voltage source to a relatively high voltage.

15. The apparatus defined in claim 13 wherein said relatively high voltage is about 5 volts.

16. The apparatus defined in claim 13 wherein said relatively very high voltage is about 15 volts.

17. The apparatus defined in claim 14 wherein said relatively high voltage is about 5 volts.

* * * * *